(12) United States Patent
Cheng et al.

(10) Patent No.: US 7,955,909 B2
(45) Date of Patent: Jun. 7, 2011

(54) STRAINED ULTRA-THIN SOI TRANSISTOR FORMED BY REPLACEMENT GATE

(75) Inventors: Kangguo Cheng, Beacon, NY (US); Junedong Lee, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 12/057,443

(22) Filed: Mar. 28, 2008

(65) Prior Publication Data

US 2009/0242936 A1     Oct. 1, 2009

(51) Int. Cl.
*H01L 21/00*     (2006.01)
*H01L 21/338*    (2006.01)

(52) U.S. Cl. . 438/149; 438/183; 438/300; 257/E21.431; 257/E21.444; 257/E21.564

(58) Field of Classification Search .......... None
See application file for complete search history.

(56) References Cited

U.S. PATENT DOCUMENTS

| | | | |
|---|---|---|---|
| 5,510,640 A * | 4/1996 | Shindo | 257/347 |
| 5,661,044 A | 8/1997 | Holland et al. | |
| 5,918,136 A | 6/1999 | Nakashima et al. | |
| 5,930,634 A | 7/1999 | Hause et al. | |
| 5,930,642 A * | 7/1999 | Moore et al. | 438/407 |
| 6,074,928 A | 6/2000 | Ogura | |
| 6,248,637 B1 | 6/2001 | Yu | |
| 6,271,132 B1 | 8/2001 | Xiang et al. | |
| 6,403,434 B1 | 6/2002 | Yu | |
| 6,420,218 B1 | 7/2002 | Yu | |
| 6,437,404 B1 * | 8/2002 | Xiang et al. | 257/347 |
| 6,486,037 B2 | 11/2002 | Norcott et al. | |
| 6,524,920 B1 | 2/2003 | Yu | |
| 6,528,362 B1 | 3/2003 | Besser et al. | |
| 6,541,356 B2 | 4/2003 | Fogel et al. | |
| 6,602,757 B2 | 8/2003 | Hovel et al. | |
| 6,607,950 B2 | 8/2003 | Henson et al. | |
| 6,696,333 B1 | 2/2004 | Zheng et al. | |
| 6,756,277 B1 | 6/2004 | Yu | |
| 6,885,084 B2 | 4/2005 | Murthy et al. | |
| 6,924,517 B2 * | 8/2005 | Chen et al. | 257/213 |
| 6,972,225 B2 | 12/2005 | Doczy et al. | |
| 7,148,548 B2 | 12/2006 | Doczy et al. | |
| 7,247,569 B2 | 7/2007 | Boyd et al. | |
| 7,288,443 B2 | 10/2007 | Zhu | |
| 2001/0049183 A1 | 12/2001 | Henson et al. | |

(Continued)

*Primary Examiner* — Julio J Maldonado
*Assistant Examiner* — Shaka Scarlett
(74) *Attorney, Agent, or Firm* — Joseph Petrokaitis (57) ABSTRACT

A semiconductor structure is described. The structure includes a transistor formed in a semiconductor substrate, the semiconductor substrate having a semiconductor-on-insulator (SOI) layer; a channel associated with the transistor and formed on a first portion of the SOI layer; and a source/drain region associated with the transistor and formed in a second portion of the SOI layer and in a recess at each end of the channel, where the second portion of the SOI layer is substantially thicker than the first portion of the SOI layer. A method of fabricating the semiconductor structure is also described. The method includes forming a dummy gate in a semiconductor substrate; performing a SIMOX process to form a SOI layer such that a first portion of the SOI layer under the dummy gate is substantially thinner than a second portion of the SOI layer; forming a source/drain extension in the SOI layer; and recessing the source/drain extension for forming a source/drain region; epitaxially growing the second portion of the SOI layer; forming an insulating layer over the epitaxial growth; removing the dummy gate for forming a gate opening; and filling the gate opening with a gate dielectric material and a gate conductor material.

5 Claims, 5 Drawing Sheets

U.S. PATENT DOCUMENTS

| | | |
|---|---|---|
| 2002/0173114 A1 | 11/2002 | Fogel et al. |
| 2002/0190318 A1 | 12/2002 | Fox et al. |
| 2003/0080361 A1 * | 5/2003 | Murthy et al. ............... 257/288 |
| 2004/0061175 A1 | 4/2004 | Fukuda |
| 2005/0082616 A1 | 4/2005 | Chen et al. |
| 2006/0286729 A1 * | 12/2006 | Kavalieros et al. ........... 438/183 |

* cited by examiner

STRAINED ULTRA-THIN SOI TRANSISTOR FORMED BY REPLACEMENT GATE

BACKGROUND OF THE INVENTION

1. Technical Field

The present disclosure relates generally to semiconductor devices and their fabrication. In particular, the present disclosure relates to a strained ultra-thin silicon-on-insulator transistor formed by replacement gate.

2. Description of Related Art

Ongoing scaling efforts of semiconductor devices not only contribute to higher integrated circuit packing density, but also improve integrated circuit performance. As the scaling process proceeds towards the physical limits of currently available semiconductor technologies and techniques, newer technologies and techniques are developed to further decrease device size and increase device performance. As device size decreases, tremendous challenges arise in the areas of device modeling accuracy and process integration. The latest technologies for fabricating integrated circuits (or ICs) using "silicon-on-insulator" (or SOI) substrates have propelled semiconductor technology ahead for another generation or two of scaling. These SOI-based technologies accomplish this by balancing more expensive SOI wafer substrates with more advanced lithographic patterning tools and techniques. Integrated semiconductor devices based on thinner SOI substrates provide fully depleted transistor bodies, effectively eliminating undesirable floating body effects. Accordingly, there is a trend in the semiconductor industry towards ultra-thin semiconductor devices based upon ever-thinner SOI substrates. Another advantage of using ultra-thin SOI substrates is that they permit the body regions of semiconductor devices to experience a "strain" condition such that carrier mobility (both electrons and holes) is enhanced. The thinner the silicon layer of the SOI substrate, the greater the strain applied to it by the gate dielectric and buried oxide layer (BOX). In addition, ultra-thin SOI transistors have the advantages of improved short-channel effect, improved sub-threshold swing, and enhanced carrier mobility. It is one of the upfront approaches for continued complementary metal oxide semiconductor (CMOS) scaling. Another approach for CMOS scaling is strain engineering. One of widely adopted strain techniques is forming embedded SiGe (eSiGe) in the source/drain (S/D) of a PFET and embedded Si:C (eSi:C) in the source/drain of an NFET to produce a strain in the channel to enhance carrier mobility. Unfortunately, it is extremely difficult, if not impossible, to form eSiGe and/or eSi:C in ultra-thin SOI devices. eSiGe and eSi:C are formed by recessing a portion of the SOI in the source/drain region and then filling the recessed portion with SiGe for PFET and Si:C for NFET. Given the fact that the silicon layer is already very thin in ultra-thin SOI, it is very difficult to recess a portion of such thin SOI layer with a precise control. Furthermore, the strain is strongly dependent on the depth of the recessed S/D. Shallow recess in ultra-thin SOI results in very limited strain effect.

Therefore, there is a need for an improvement in forming embedded S/D in UTSOI.

SUMMARY OF THE INVENTION

The present disclosure is directed to structure and method of forming a strained ultra-thin silicon-on-insulator transistor having embedded source/drain (e.g. embedded SiGe). In one embodiment, a semiconductor structure is described. The structure includes a transistor formed in a semiconductor substrate, the semiconductor substrate having a semiconductor-on-insulator (SOI) layer; a channel associated with the transistor and formed on a first portion of the SOI layer; and a source/drain region associated with the transistor and formed in a second portion of the SOI layer and in a recess at each end of the channel, wherein the second portion of the SOI layer is substantially thicker than the first portion of the SOI layer; and wherein the source/drain region includes a stressor material. The structure further includes a high-k metal gate disposed above the channel, and a source/drain extension formed between the channel and a corresponding the source/drain region, each the source/drain extension and the corresponding source/drain region being aligned to the high-k metal gate and the channel. In one particular embodiment, the SOI layer is formed over a stair-shaped buried insulating (BOX) layer. In another embodiment, the semiconductor substrate includes further includes a BOX layer and formed over a base substrate layer, wherein the SOI layer is formed over the BOX layer. The stressor material is selected from a group consisting of eSiGe, eSi:C and a combination thereof. In addition, the stressor material in the source/drain region is substantially thicker than the first portion of the SOI layer. In one particular embodiment, the first portion of the SOI layer includes a thickness ranging from about 5.0 nm to about 70.0 nm, and wherein the second portion of the SOI layer includes a thickness ranging from about 20.0 nm to about 70.0 nm. The first portion of the SOI layer includes a thickness ranging from about 5.0 nm to about 70.0 nm. The transistor is a strained filed effect transistor (FET).

In another embodiment, a semiconductor device is described. The device includes a field effect transistor including: a thin channel formed in a first portion of a semiconductor-on-insulator (SOI) layer; a high-k metal gate disposed above the thin channel; and a source/drain region formed in a second portion of the SOI layer and in a recess at each end of the thin channel, wherein the second portion of the SOI layer is substantially thicker than the first portion of the SOI layer; and a stair-shaped buried insulating (BOX) layer insulating the SOI layer from a base semiconductor substrate; wherein the source/drain region includes a stressor material selected from a group consisting of eSiGe, eSi:C and a combination thereof; wherein the stressor material is substantially thicker that the first portion of the SOI layer. The device further includes a source/drain extension formed between the thin channel and the stressor material, wherein each of the source/drain extension and the corresponding stressor material is aligned to the metal gate and the thin channel. The device further includes a source/drain extension formed between the channel and a corresponding the source/drain region, each the source/drain extension and the corresponding source/drain region being aligned to the high-k metal gate and the channel. In one particular embodiment, the stressor material includes a thickness ranging from about 20.0 nm to about 70.0 nm; and the first portion of the SOI layer includes a thickness ranging from about 5.0 nm to about 70.0 nm. In addition the first portion of the stressor material includes a thickness ranging from about 20.0 nm to about 70.0 nm, and wherein the second portion of the SOI layer includes a thickness ranging from about 20.0 nm to about 70.0 nm. Moreover, the first portion of the SOI layer includes a thickness ranging from about 5.0 nm to about 70.0 nm, and wherein the second portion of the SOI layer includes a thickness ranging from about 20.0 nm to about 70.0 nm.

A method of forming a semiconductor structure is also described. The method includes forming a dummy gate in a semiconductor substrate; performing a SIMOX process to form a semiconductor-on-insulator (SOI) layer such that a first portion of the SOI layer under the dummy gate is substantially thinner than a second portion of the SOI layer; forming a source/drain extension in the SOI layer; and recessing the source/drain extension for forming a source/drain region; epitaxially growing the second portion of the SOI layer; forming an insulating layer over the epitaxial growth; removing the dummy gate for forming a gate opening; and filling the gate opening with a gate dielectric material and a gate conductor material. The SOI layer is formed over a stair-shaped buried insulating (BOX) layer. In addition, the source/drain region includes a stressor material, wherein the stressor material is selected from a group consisting of eSiGe, eSi:C and a combination thereof. In one particular embodiment, the first portion of the SOI layer includes a thickness ranging from about 5.0 nm to about 70.0 nm, and wherein the second portion of the SOI layer includes a thickness ranging from about 20.0 nm to about 70.0 nm.

In a second embodiment of a method of forming a semiconductor structure, the method includes forming a dummy gate in thinned portion of a semiconductor-on-insulator (SOI); forming source/drain extensions in the SOI layer abutting the thinned portion of the SOI layer; forming an interlayer dielectric; removing the dummy gate for forming a gate opening; and forming a gate dielectric and a gate conductor in the gate opening. The SOI layer is formed over a stair-shaped buried insulating (BOX) layer.

Other features of the presently disclosed structure and method of forming a strained ultra-thin silicon-on-insulator transistor formed by replacement gate will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming a strained ultra-thin silicon-on-insulator transistor formed by replacement gate will be described hereinbelow with references to the figures, wherein.

DETAILED DESCRIPTION

Referring now to the drawing figures, wherein like references numerals identify identical or corresponding elements, an embodiment of the presently disclosed structure and method of forming a strained ultra-thin silicon-on-insulator transistor formed by replacement gate, will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the disclosure. Thus, the materials described herein are employed to illustrate the disclosure in one application and should not be construed as limiting.

The present disclosure provides a structure and method for forming an ultra-thin silicon-on-insulator transistor having embedded source/drain, such as, for example, SiGe. In one particular aspect of the disclosure, a high-k metal gate is provided by replacement gate method. A dummy gate is used for forming a stair buried oxide for facilitating the formation of the embedded SiGe, in a manner described in detail hereinbelow.

FIGS. 1-8 illustrate a structure and method of forming a strained ultra-thin silicon-on-insulator transistor formed by replacement gate. In particular, the structure includes a field effect transistor formed on a semiconductor-on-insulator (SOI) layer having a first portion and a second portion, where the second portion of the SOI layer is substantially thicker than the first portion of the SOI layer. In particular, the field effect transistor includes a thin channel formed in the first portion of the semiconductor-on-insulator (SOI) layer; a metal gate disposed above the thin channel; and a source/drain region formed in the second portion of the SOI layer and in a recess at each end of the thin channel. The source/drain region includes a stressor material selected from a group consisting of eSiGe, eSi:C and a combination thereof. In addition, the stressor material is substantially thicker than the first portion of the SOI layer. In one particular embodiment, the SOI layer is formed on a stair-shaped buried insulating (BOX) layer insulating the SOI layer from a base semiconductor substrate.

FIGS. 1-8 further illustrate a method of forming a strained ultra-thin silicon-on-insulator transistor formed by replacement gate. The method includes forming a dummy gate in a semiconductor substrate; performing a SIMOX process to form a semiconductor-on-insulator (SOI) layer such that a first portion of the SOI layer under the dummy gate is substantially thinner than a second portion of the SOI layer; forming a source/drain extension in the SOI layer; and recessing a portion of the second SOI layer for forming a source/drain region; epitaxially growing the second portion of the SOI layer; forming an insulating layer; removing the dummy gate for forming a gate opening; and filling the gate opening with a gate dielectric material and gate conductor material.

Figure 1:
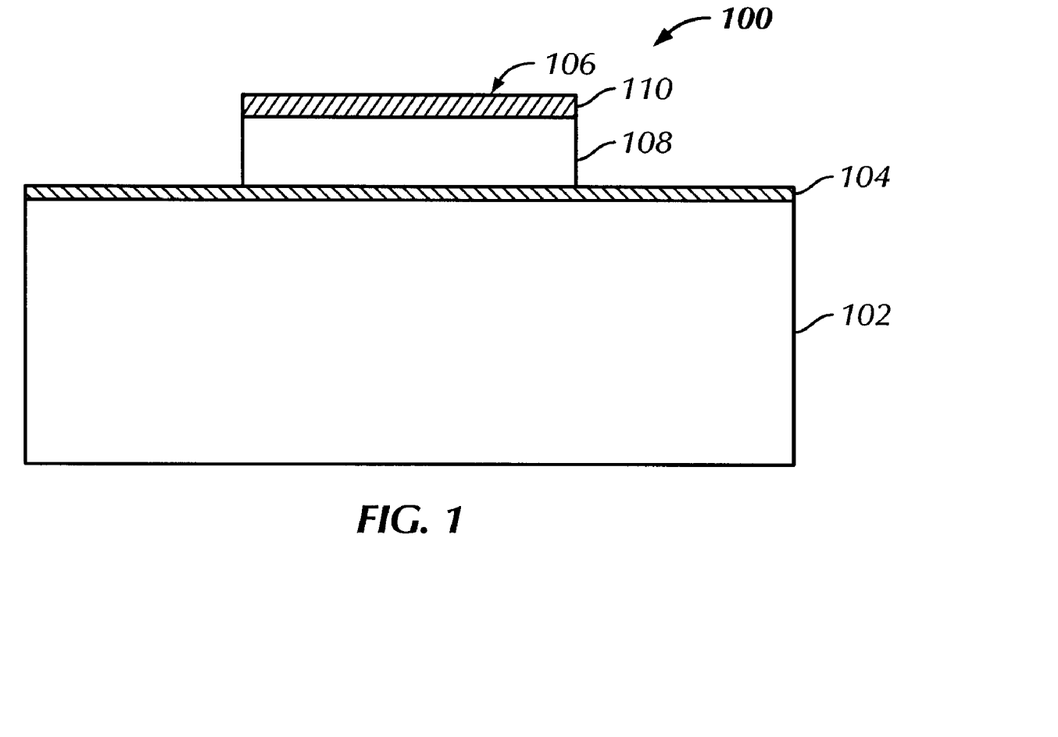
FIGS. 1-8 illustrate simplified cross-sectional views of progressive stages of a method of forming a strained ultra-thin silicon-on-insulator transistor formed by replacement gate, in accordance with one embodiment of the present disclosure.

With initial reference to FIG. 1, an embodiment of a bulk silicon wafer, in accordance with the present disclosure, is illustrated and is designated generally as silicon wafer 100. Silicon wafer 100 includes a handle substrate or base semiconductor substrate 102 and a dielectric (e.g. oxide and/or nitride) layer 104 formed in an upper surface of base semiconductor substrate 102 using conventional techniques such as deposition or oxidation. Dielectric layer 104 includes a thickness ranging from about 2 nm to about 10 nm. A dummy gate 106 is then formed by a conventional patterning method (e.g. lithography and reactive ion etch (RIE)) atop dielectric layer 104. Dummy gate 106 includes a polysilicon layer 108 and a cap (e.g. nitride) layer 110 formed on top of polysilicon layer 108. Polysilicon layer 108 includes a thickness ranging from about 10 nm to about 100 nm and it may be formed by deposition, such as, for example chemical vapor deposition (CVD). Cap layer 110 includes a thickness ranging from about 1 nm to about 10 nm may be formed by nitridation or deposition.

Base semiconductor substrate 102 may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, base semiconductor substrate 102 may be about, but is not limited to, several hundred microns thick. For example, base semiconductor substrate 102 may include a thickness ranging from about 0.5 mm to about 1.5 mm.

Figure 2:
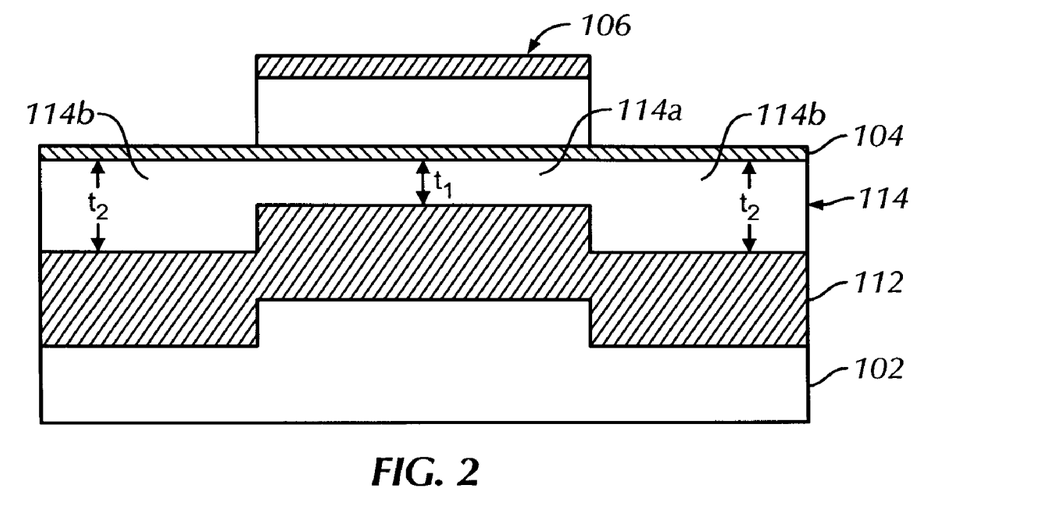
Figure 3:
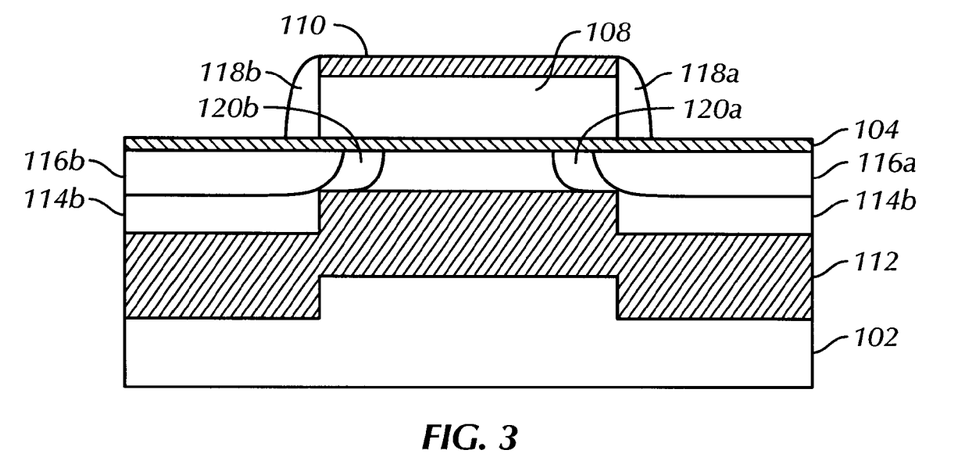

With reference to FIG. 2, a buried insulating (e.g. buried oxide (BOX)) layer 112 is formed on base semiconductor substrate 102. In addition, silicon-on-insulator (SOI) structure 114 is formed on BOX layer 112, where BOX layer 112 isolates SOI structure 114 from base semiconductor substrate 102. In one particular embodiment, SOI structure 114 is formed using a technique referred to as separation by implanted oxygen (SIMOX) wherein ions, typically oxygen, are implanted into a bulk Si-containing substrate (i.e. base semiconductor substrate 102). Base semiconductor substrate 102 having the implanted ions is then annealed under conditions that are capable of forming BOX layer 112. Other SIMOX processes and conditions are also envisioned. For example, the various SIMOX processes and conditions mentioned in U.S. Pat. No. 6,074,928 and co-assigned U.S. Patent Application Publication Nos. 20020190318 and 20020173114, and U.S. Pat. Nos. 5,930,634, 6,486,037, 6,541,356 and 6,602,757, the entire contents of which are incorporated herein by reference. Other alternative methods of forming SOI structure 114 and BOX layer 112, such as, for example, a layer transfer process such as, a bonding process, as also envisioned.

With continued reference to FIG. 2, it is noted that dummy gate 106 causes the implanted oxygen (from the SIMOX process) to be substantially shallower in the areas directly under dummy gate 106 than other areas not covered by dummy gate 106, as illustrated by the figure. In particular, SOI structure 114 includes a first portion 114a having a thickness t1 and a second portion 114b having a thickness t2, where t2 is substantially thicker than t1 (i.e. t1<t2). In one particular embodiment, t1 ranges from about 2 nm to about 100 nm and more preferably, from 5 nm to about 20 nm and t2 ranges from about 20 nm to about 200 nm, and more preferably from about 50 nm to about 100 nm, greater than t1. Moreover, BOX layer 112 takes on a stair-shape due to the presence of dummy gate 106. BOX layer 112 has a thickness ranging from about 20 nm to about 500 nm, and more preferably of about 100 nm With reference to FIG. 3, source/drain (S/D) extension 116a, 116b and spacers 118a, 118b are formed using conventional methods. Optionally, a halo 120a, 120b is also formed adjacent S/D extensions 116a, 116b respectively. Halo 120a, 120b and S/D extensions 116a, 116b may be formed by ion implantation, plasma doping, and/or any other suitable techniques known in the art. In one embodiment, halo 120a, 120b are butted to BOX layer 112 and are formed in first portion 114a of SOI structure 114 (i.e. under dummy gate 106). S/D extensions 116a, 116b is also butted to BOX layer 112 and is formed in second portion 114b of SOI structure 114. Spacers 118a, 118b are formed on the sidewalls of dummy gate 106 by deposition (e.g. CVD) and directional etch such as reactive ion etch (RIE). Spacers 118a, 118b may include any of several materials such as oxide, nitride, low-k material, high-k material, or the combination of those materials. For simplicity, halo 120a, 120b is omitted in subsequent figures.

Figure 4:
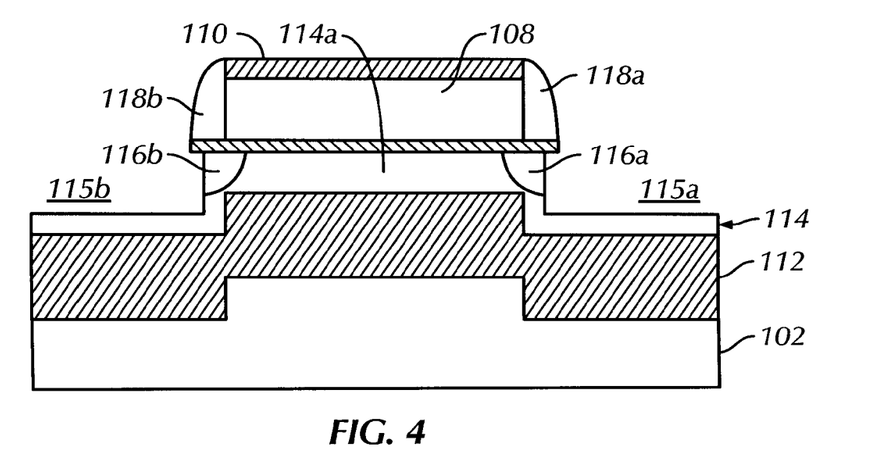

With reference to FIG. 4, using conventional methods well known in the art, S/D extensions 116a, 116b are recessed (i.e. etched), for example, by RIE, to a predetermined depth, for forming a S/D region 115a, 115b adjacent dummy gate 106. The depth of S/D region 115a, 115b is about 20 nm to 100 nm, depending on the thickness of SOI layer 114.

Figure 5:
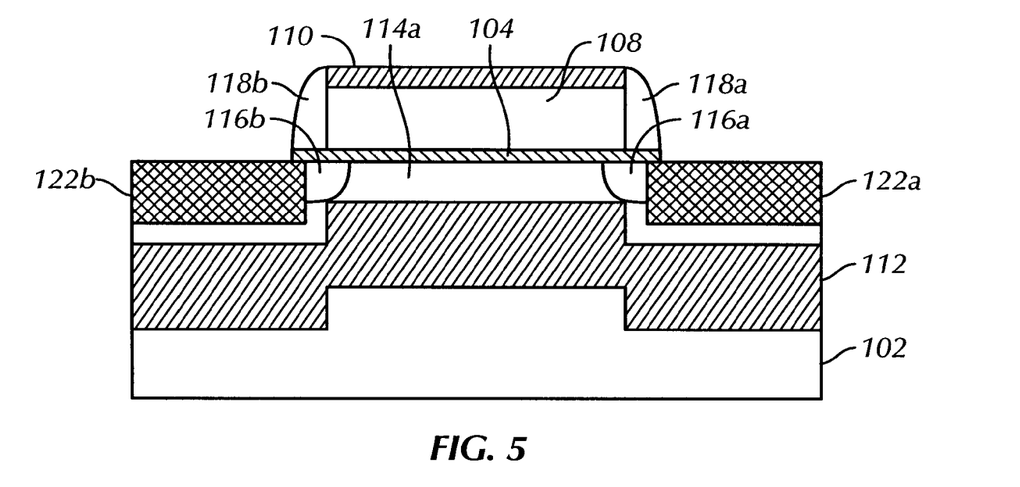

With reference to FIG. 5, a stress material (e.g. SiGe for PFET stack and Si:C for NFET stack) is epitaxially grown in S/D regions 115a, 115b. For example, a highly compressive selective epitaxial SiGe layer 122a, 122b is grown in S/D regions 115a, 115b of a pFET stack, fully filling S/D etched regions 115a, 115b of a pFET stack. SiGe layer 122a, 122b may be grown to a thickness of about 10 nm to 100 nm thick, although other thicknesses are also contemplated by the disclosure. Alternatively, a highly tensile selective epitaxial Si:C layer is grown to a thickness of about 10 nm to 100 nm thick in S/D regions 115a, 115b of an nFET stack. In one embodiment, the SiGe and/or eSi:C layer can be in-situ doped (i.e. doping during epitaxial growth). Alternatively, SiGe and/or Si:C is doped after the epitaxial growth, for example, by ion implantation, plasma doping, and/or any other suitable doping techniques.

Figure 6:
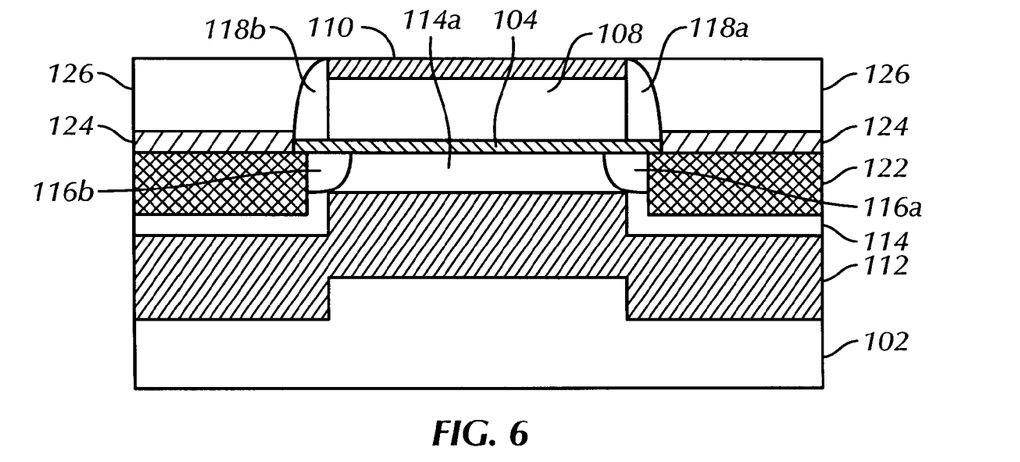
Figure 7:
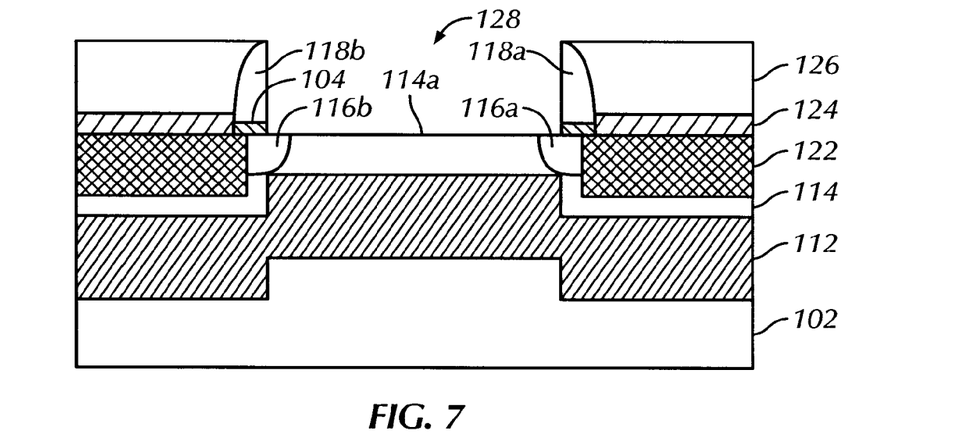
Figure 8:
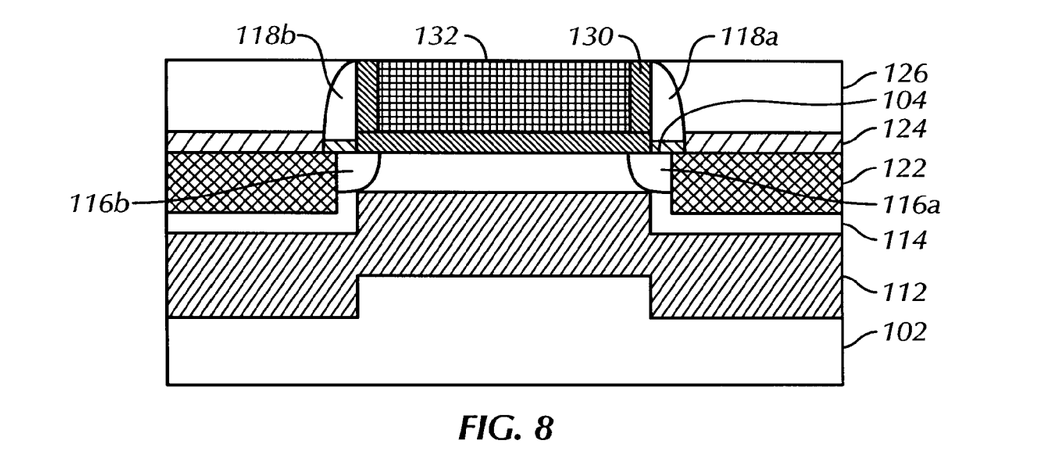

With reference to FIGS. 6-8, conventional replacement gate processes is followed, as described, for example, in U.S. Pat. No. 6,885,084. In particular, with reference to FIG. 6, a silicide layer 124 is formed. In one particular embodiment, silicide layer 124 includes a nickel silicide, which is formed by deposition of nickel (Ni) which reacts with epitaxial layer 122a, 122b to form silicide by thermal annealing. An interlayer dielectric (ILD) layer 126 is then deposited and planarized for exposing dummy gate 106. The ILD layer 126 may comprise oxide, nitride, low-k dielectric, high-k dielectric, or any combination of those materials. The exposed dummy gate 106 (i.e. gate oxide 104, polysilicon layer 108 and cap layer 110) is removed using conventional methods well known in the art, for forming gate opening 128, as illustrated in FIG. 7. Dummy gate 106 may be removed, for example, by dry etch, wet etch, or a combination of both.

With reference to FIG. 8 gate dielectric 130 and gate conductor 132 are formed in gate opening 128 by using conventional steps. In particular, gate dielectric 130 is formed in gate opening 128. Gate conductor 132 is then formed by deposition and planarization. Examples of gate dielectric 130 include but are not limited to silicon oxide, silicon nitride, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, and any combination of these materials. Examples of gate conductor includes but are not limited to Zr, W, Ta, Hf, Ti, Al, Co, Ni, Ru, Pa, Pt, metal oxide, metal carbide, transition metal aluminides such as Ti3Al, ZrAl, TaC, TaMgC, TiAlN, WCN, metal oxide, metal nitride such as Mo2N, MoAlN, TiN, TaN, or any combination of those materials.

Gate dielectric 130 and gate conductor 132 can be formed by conventional methods, including but not limited to, atomic layer deposition (ALD), chemical vapor deposition (CVD), high temperature oxide deposition (HTO), low temperature oxide deposition (LTO), chemical oxidation, thermal oxidation, thermal nitridation, ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of those methods.

Figure 9:
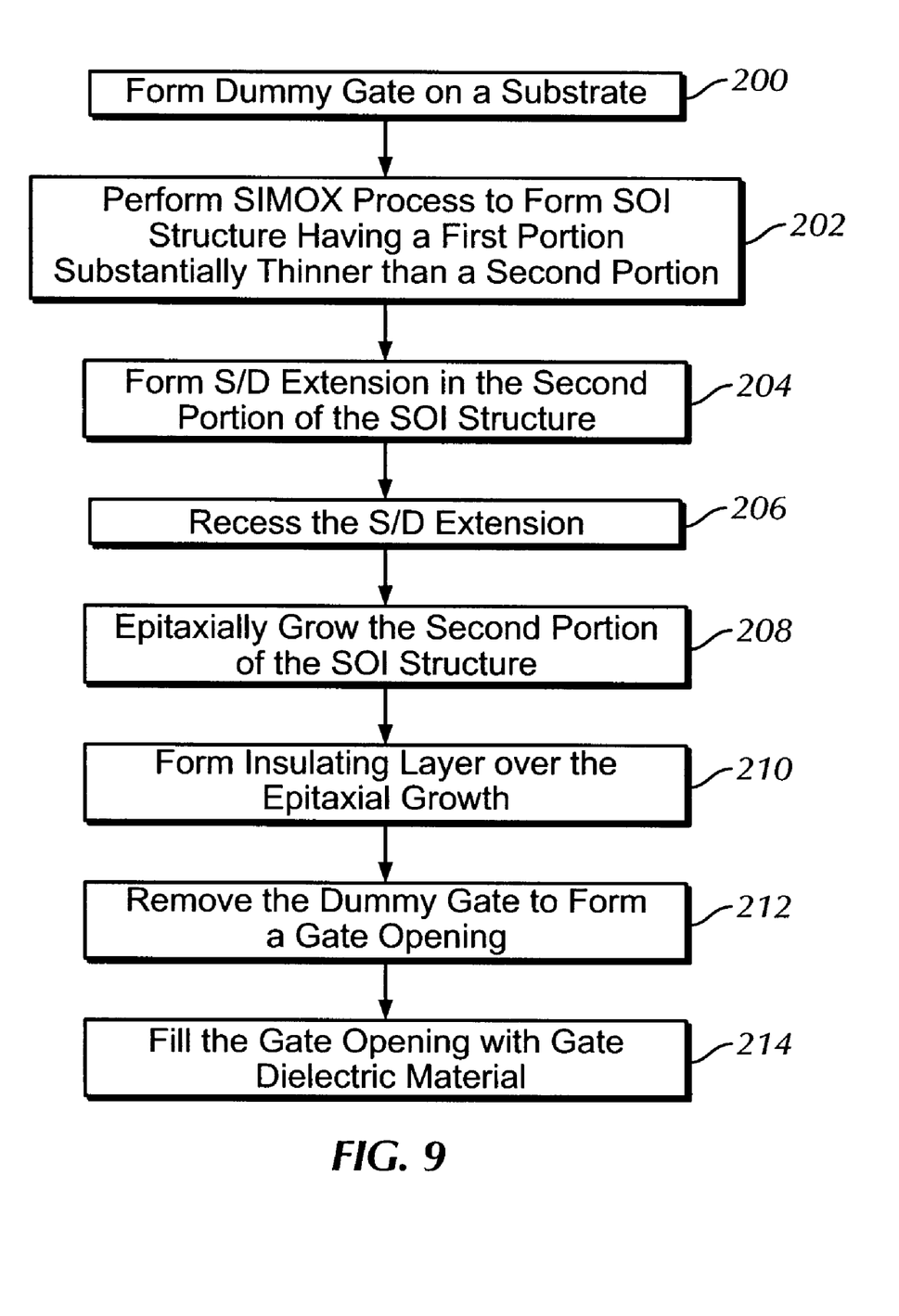
FIG. 9 is an exemplary flow diagram illustrating a method of forming a strained ultra-thin silicon-on-insulator transistor formed by replacement gate, in accordance with one embodiment of the present disclosure.

With reference to FIG. 9, in conjunction with FIGS. 1-8, a flow diagram of an exemplary method of forming a strained ultra-thin silicon-on-insulator transistor formed by replacement gate, in accordance with the present disclosure, is illustrated. Initially, at step 200, a dummy gate 106 if formed over a device structure, such as, for example a silicon substratel O₂, as discussed hereinabove. In accordance with the present disclosure, at step 202, a SIMOX process is performed to form a SOI structure 114 having a first portion 114a substantially thinner than a second portion 114b. At step 204, a S/D extension is formed in the second portion 114 of the SOI structure 114. At step 206, the S/D extension is recessed by conventional methods. At step 208, the second portion 114b of SOI structure 114 is epitaxially grown for filling the recessed S/D extension with a stress material, such as, for example, SiGe for PFET and Si:C for NFET. At step 210, an insulating layer 124 is formed over the epitaxial growth. At step 212, dummy gate 106 is removed for forming a gate opening 128. Finally, at step 214, gate opening 128 is filled with gate dielectric material and gate conductor material.

It will be understood that numerous modifications and changes in form and detail may be made to the embodiments of the presently disclosed structure and method of forming a strained ultra-thin silicon-on-insulator transistor formed by replacement gate method. It is contemplated that numerous other configuration of the interconnect structure may be formed, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of forming a semiconductor structure, the method comprising:
    forming a dummy gate in a semiconductor substrate;
    performing a SIMOX process to form a semiconductor-on-insulator (SOI) layer such that a first portion of said SOI layer under said dummy gate is substantially thinner than a second portion of said SOI layer, wherein said SOI layer is formed over a stair-shaped buried insulating (BOX) layer, said BOX layer having a first surface under said first portion of said SOI layer and a second surface under said second portion of said SOI layer, wherein said first surface and said second surface form a right angle step, wherein said BOX layer includes a thickness ranging from about 20.0 nm to about 500.0 nm and wherein said first portion of said SOI layer includes a thickness less than 50 nm;
    forming a source/drain extension in said SOI layer; and
    recessing said source/drain extension for forming a source/drain region;
    epitaxially growing said second portion of said SOI layer;
    forming an insulating layer over said epitaxial growth;
    removing said dummy gate for forming a gate opening; and
    filling said gate opening with a gate dielectric material and a gate conductor material, wherein said epitaxial growth is entirely below a bottom of said gate dielectric material.

2. The method recited in claim 1, wherein said source/drain region includes a stressor material.

3. The method recited in claim 1, wherein said stressor material is selected from a group consisting of epitaxial silicon germanium (eSiGe), epitaxial silicon carbide (eSi:C) and a combination thereof.

4. The method recited in claim 1, wherein said second portion of said SOI layer includes a thickness less than 50 nm.

5. A method of forming a semiconductor structure, the method comprising
    forming a dummy gate in thinned portion of a semiconductor-on-insulator (SOI);
    forming source/drain extensions in said SOI layer abutting said thinned portion of said SOI layer;
    recessing said source/drain extensions for forming a source/drain region, wherein said source/drain region includes an epitaxially grown stress material, wherein said stress material is substantially thicker than said thinned portion of said SOI layer;
    forming an interlayer dielectric;
    removing said dummy gate for forming a gate opening; and
    forming a gate dielectric and a gate conductor in said gate opening;
    wherein said SOI layer is formed over a stair-shaped buried insulating (BOX) layer, said BOX layer having a first portion below said gate opening and a second portion below said stress material, wherein said first portion and said second portion form a right angle step.

* * * * *